(12) United States Patent
Rafailov et al.

(10) Patent No.: US 7,847,254 B2
(45) Date of Patent: Dec. 7, 2010

(54) PHOTOCONDUCTIVE DEVICE

(75) Inventors: Edik U. Rafailov, Dundee (GB); Nart Daghestani, Dundee (GB)

(73) Assignee: NCR Corporation, Duluth, GA (US)

( * ) Notice: Subject to any disclaimer, the term of this patent is extended or adjusted under 35 U.S.C. 154(b) by 586 days.

(21) Appl. No.: 12/004,360

(22) Filed: Dec. 20, 2007

(65) Prior Publication Data

US 2010/0276594 A1 Nov. 4, 2010

(51) Int. Cl.
*G01J 5/02* (2006.01)
(52) U.S. Cl. .................................. 250/341.1
(58) Field of Classification Search ... 250/338.1–338.5, 250/341.1, 200, 201.1, 206, 206.1, 208.1, 250/208.2, 208.5, 208.6, 214 R, 214.1, 216, 250/213.16; 359/245, 315, 320, 322; 257/431, 257/458, 461
See application file for complete search history.

(56) References Cited

U.S. PATENT DOCUMENTS

| | | | |
|---|---|---|---|
| 4,975,567 A | 12/1990 | Bishop | |
| 6,198,091 B1 * | 3/2001 | Forrest et al. | 250/214.1 |
| 7,057,788 B2 * | 6/2006 | Ohbayashi et al. | 359/260 |
| 2005/0215031 A1 * | 9/2005 | Ouchi | 438/459 |
| 2006/0152412 A1 * | 7/2006 | Evans et al. | 343/700 MS |

OTHER PUBLICATIONS

Nampoothiri et al., "Ultrafast conductivity in amorphous semiconductors stuided by time-resolved THz spectroscopy," 2005, IEEE Conference on Lasers and Electro-Optics, vol. 1, 2 pp.*
Hattori et al., "Large-Aperture THz Emitter with Interdigitated Electrodes," 2005, IEEE Conferences on THz Technology, Ultrafast Measurments, and Imaging, pp. 457-458.*
Darmo et al., "Few-cycle terahertz generation and spectroscopy of nanostructures," 2004, Philosophical Transactions of the Royal Society a Mathmatical, Physical and Engineering Sciences, vol. 362, pp. 251-262.*

* cited by examiner

*Primary Examiner*—David P Porta
*Assistant Examiner*—Kiho Kim
(74) *Attorney, Agent, or Firm*—Michael Chan (57) ABSTRACT

A photoconductive device (2) comprises a plurality of photoconductive layers (6, 8, 10, 12), each photoconductive layer comprising photoconductive material (4) and a respective plurality of electrodes (16, 18), wherein the photoconductive layers (6, 8, 10, 12) are electrically connected together.

21 Claims, 11 Drawing Sheets

PHOTOCONDUCTIVE DEVICE

The present invention relates to a photoconductive device, and in particular to a photoconductive device for generation or detection of electromagnetic radiation, especially terahertz radiation.

Recent advances in THz technology for the continuous wave (cw) and pulsed regimes are opening up new avenues for research and enabling a wide range of basic and applied science applications including submillimeter-wave chemistry, medicine, astrophysics, mm-wave RF sensors, collision avoidance radar systems and ultrafast signal processing.

The use of terahertz (THz) radiation has been proposed, in particular, for imaging techniques for security, material validation and tamper indication applications. The use of THz radiation is preferred to x-ray radiation in such applications for a number of reasons but primarily it avoids the ionization effects of x-ray which can have devastating effects on live tissue. However, THz radiation is costly to produce in bandwidths and power levels required of many applications.

Known sources of THz radiation include Gunn diodes which operate up to 800 GHz but at low output powers. For frequencies above 800 GHz far-infrared gas lasers are often used. Although they can generate higher output powers they are bulky, power hungry, and suffer from critical alignment problems.

An alternative known approach involves heterodyne conversion or photomixing. According to such an approach, a solid state detector is coupled to a tunable optical system. The solid state detector is in the form of a photomixer device comprising a layer of photoconductive material and electrodes separated by the photoconductive material. A bias voltage is applied across the electrodes.

The tunable optical system comprises two single-frequency lasers or a single laser diode that is used to generate multimode frequencies. Laser beams having slightly different frequencies are applied to the photomixer device by the tunable optical system. The mixture of laser beams of different frequencies modulates the photo-conductance of the photoconductive material at a modulation or difference frequency in the THz range, and cause generation of an electrical signal having a frequency or frequencies in the THz range. The photomixer device is connected to an integrated transmit antenna and the generated electrical signals pass through the antenna causing generation of THz electromagnetic radiation.

The photomixer devices used in such known THz sources are usually single layered devices, and are usually formed of low temperature GaAs (LT-GaAs).

LT-GaAs has short photoconductive lifetimes (t<0.25 ps) and high electrical breakdown field strengths ($E_B$>5×10$^5$ V cm−1) together with a relatively high mobility ($\mu \approx 200$ cm$^2$/Vs). However, the problem of local heating in the photomixer has been a major factor that limits the conversion efficiency in LT-GaAs photomixers. Another practical limitation that tends to reduce output power levels from LT-GaAs photomixers in the higher frequency range derives from the observation that the photoconductive lifetimes increase under the conditions of high applied voltage bias levels.

It has been found that the output power of single layered LT-GaAs photomixers attenuates greatly at higher frequencies. It has also been found that the output power of such devices cannot be increased beyond a certain level by increasing the power of the input laser beams as the device then overheats and does not operate effectively.

Similar single layered LT-GaAs photoconductive devices are also used in pulsed techniques in which a pulse of radiation is applied to the photoconductive LT-GaAs material, causing transient currents to flow across the photoconductive material between the biased electrodes. The currents are passed through a transmit antenna to generate electromagnetic radiation. If the length of the pulse is sufficiently short, of the order of femtoseconds, then the transient currents will include components at THz frequencies.

Such pulsed techniques are inherently broadband, as the resulting pulsed radiation will include components at a wide range of different frequencies. The limitations of the power versus frequency spectrum, and the overheating problems at higher powers, arising from the use of single layer LT-GaAs still apply.

It is an aim of the present invention to provide an improved, or at least alternative, photoconductive device.

In a first, independent aspect the present invention provides a photoconductive device comprising a plurality of photoconductive layers, each photoconductive layer comprising photoconductive material and a respective plurality of electrodes, wherein the photoconductive layers are electrically connected together.

By providing a plurality of photoconductive layers that are electrically connected together, signals from each of the photoconductive layers may be combined. A higher amount of optical pump radiation applied to the device may be absorbed by a plurality of photoconductive layers than by a single photoconductive layer alone, and thus improved efficiency may be provided. In particular, the output power from a device comprising a plurality of photoconductive layers may be higher than for a similar device comprising a single photoconductive layer.

The photoconductive device may have a stacked structure, with the photoconductive layers stacked one on top of another.

Photoconductive material is material whose electrical conductivity changes when exposed to light or other electromagnetic radiation. The photoconductive material is usually semiconducting or insulating when not exposed to light or other electromagnetic radiation, and has an electrical conductivity that varies in dependence upon the amplitude of radiation of appropriate frequency applied to the photoconductive material.

The or each electrical connection between electrodes may comprise metallic material. The or each electrical connection is preferably non-photoconductive material. The or each electrical connection may be formed by doping of photoconductive material after deposition, or by etching of photoconductive material after deposition and depositing metallic material in the etch pattern.

Preferably the device further comprise a bias voltage source for applying a bias voltage across the electrodes of each photoconductive layer. If a bias voltage is applied across the electrodes, then any variation in the photoconductance of the photoconductive material due to application of radiation will cause a corresponding variation in the current flowing between the electrodes. If radiation of a particular frequency is applied to the photoconductive material then an a.c. current at that frequency may be obtained between the electrodes.

The photoconductive layers may be photomixing layers and the photoconductive device may be a photomixing device.

In operation, each photomixing layer may received a mixture or superposition of two or more beams of electromagnetic radiation of different frequency, and the photoconductivity of each photoconductive layer may thus be modulated at a difference or modulation frequency equal to the difference between the frequencies of the different beams.

Preferably, the photoconductive layers are electrically connected in series.

It has been found for certain embodiments that desired power versus frequency characteristics, particularly at higher frequencies, and faster response may be obtained by electrically connecting the photoconductive layers in series. The roll-off of power versus frequency at higher frequencies for such embodiments may be less steep for devices with serially connected photoconductive layers than for similar devices with a single photoconductive layer or a plurality of parallel connected photoconductive layers. A photoconductive device in which the photoconductive layers are electrically connected in series may be particularly useful as a source of radiation.

At least one electrode of one layer may be electrically connected in series to at least one electrode of at least one other layer.

For each photoconductive layer, each electrode may be electrically connected in series to an electrode of an adjacent photoconductive layer.

Alternatively, the photoconductive layers are electrically connected in parallel.

It has been found that by electrically connecting the photoconductive layers of the photoconductive device in parallel, increased photoconductance, and thus increased absorption, may be obtained in operation. A photoconductive device in which the photoconductive layers are electrically connected in parallel may be particularly useful as a detector.

The photoconductive material may comprise a silicon-based material.

The thermal conductivity of Si based materials can be relatively high, and so in certain embodiments including Si-based material, heat may be dissipated more quickly, leading to reduced problems with overheating of the device in operation and enabling the use of higher optical input powers. Furthermore, Si-based materials may be deposited on a wide range of different materials, and may be deposited in multiple layers, enabling the production of devices with desired physical and electrical characteristics. In addition, Si-based materials can have larger breakdown field strengths than for example LT-GaAs. The breakdown field strength, and gap width between electrodes, Wg, may determine the maximum bias voltage (Vb), and the higher Vb, the higher the output power.

The photoconductive material may comprise one of nano-crystalline silicon (nc-Si) and amorphous silicon (a-Si), and preferably comprises one of hydrogenated nano-crystalline silicon (nc-Si:H) and hydrogenated amorphous silicon (a-Si:H).

Those materials in particular have been found to have a combination of relatively high thermal conductivity and desired electrical properties.

Amorphous silicon (a-Si) is a non-crystalline allotropic form of Si. Amorphous silicon (a-Si) may be hydrogenated to reduce the number of dangling bonds and to stabilise electronic behaviour, to produce hydrogenated amorphous silicon (a-Si:H).

Nanocrystalline silicon (nc-Si) is a polycrystalline form of silicon. Nanocrystalline silicon (nc-Si) may comprise nanoscale crystallites of silicon embedded in an amorphous silicon (a-Si) matrix. Hydrogenated nanocrystalline silicon (nc-Si:H) may comprise nanoscale crystallites of silicon embedded in an hydrogenated amorphous silicon (a-Si:H) matrix.

The level of hydrogenation in the hydrogenated materials may be characterised by the hydrogen dilution ratio $R = H_2/SiH_4$. Preferably the hydrogen dilution ratio is between 3 and 10, and more preferably is substantially equal to 10.

Each of the amorphous silicon (a-Si), hydrogenated amorphous silicon (a-Si:H), nano-crystalline silicon (nc-Si), and hydrogenated nano-crystalline silicon (nc-Si:H) materials can readily be grown on substrates with high thermal conductivities, thus reducing overheating problems. Also, each of those materials can be grown layer-over-layer, enabling the production of multi-layered devices. In contrast, LT-GaAs cannot readily be grown layer-over-layer making the production of multi-layered structures difficult.

The photoconductive device may have between two and twenty photoconductive layers, or between three and ten photoconductive layers, and preferably has between four and six photoconductive layers.

The average thickness of the photoconductive layers may be between 10 nm and 1200 nm, or between 100 nm and 500 nm, and preferably is between 200 nm and 400 nm.

For each photoconductive layer, the plurality of electrodes may be interdigitated electrodes. Each interdigitated electrode may have between 2 and 40 fingers, preferably between 10 and 30 fingers, more preferably between 15 and 25 fingers. There may be two electrodes for each layer, which may be considered to be an anode and a cathode.

Preferably, for each photoconductive layer, the shortest distance between one electrode of the layer and another electrode of the layer is between 0.01 μm and 10 μm, or between 0.05 μm and 5 μm, and preferably is between 0.05 μm and 2 μm. The gap size may be chosen in order to produce desired values of resistance and capacitance, and/or bias voltage, for the device.

The device may further comprise a substrate. By providing a suitable substrate, thermal and structural characteristics may be improved. Preferably the stacked photoconductive layers are stacked on the substrate.

The substrate may comprise a material having a thermal conductivity greater than $1$ $Wcm^{-1} °C.^{-1}$, preferably greater than $10$ $Wcm^{-1} °C.^{-1}$, and more preferably greater than $50$ $Wcm^{-1} °C.^{-1}$.

The substrate may comprise one of diamond and SiC, sapphire

The rate of heat dissipation of the device may be increased by the use of a substrate of diamond or SiC, each of which has a high thermal conductivity. In contrast, it would not have been considered to include a substrate of diamond or SiC, or similar high thermal conductivity materials, in prior art devices based on LT-GaAs as LT-GaAs cannot be deposited successfully on such materials.

The substrate may comprise a reflective layer (for example, dielectric, metal or DBR (distributed Bragg reflected) mirrors). Thus, radiation that has passed through the photoconductive device may be reflected back through the photoconductive device, causing absorption of a greater amount of the radiation and increasing the photoconductivity. In addition, an anti-reflecting coating may be added on the top of the device to improve output power. The anti-reflecting coating is preferably arranged so that it allows light to pass into the device, but reflects light from inside the device.

The photo-conductive material may be responsive to radiation of frequency in at least one of the range from 25 GHz to 10 THz, the range from 50 GHz to 5 THz, the range from 100 GHz to 3 THz, and the range from 1 THz to 3 THz.

By the photoconductive material being responsive to radiation having a frequency in a range is meant that if electromagnetic radiation of that frequency is applied to the photoconductive material, the electrical conductivity of the photoconductive material changes in response to the electromagnetic radiation.

The photoconductive device may be arranged relative to at least one radiation source, to receive radiation from the at least one radiation source. Preferably the photoconductive device is arranged so that radiation from the radiation source is received in a direction perpendicular to the photoconductive layers.

The received radiation may be laser radiation. The received radiation may be continuous wave (CW) radiation. Alternatively the received radiation may be pulsed radiation, for example from a femtosecond laser source with a repetition rate from few Hz up to few GHz. The received radiation may have at least one difference-frequency in the range 25 GHz to 10 THz, preferably in the range 100 GHz to 5 THz, and more preferably in the range from 500 GHz to 3 THz.

The received radiation may comprise a superposition of two or more beams of radiation. The beams of radiation may be laser beams. The photoconductive device may receive a mixture or superposition of radiation beams, the mixture or superposition of radiation beams forming a modulation signal having a modulation or difference frequency equal to the difference in frequencies of the mixed or superposed beams. The modulation signal may have at least one frequency in the range 25 GHz to 10 THz, preferably in the range from, or from 50 GHz to 5 THz, and more preferably in the range from 25 GHz to 3 THz, or from 1 THz to 3 THz. The modulation signal may have at least one frequency greater than or equal 1 THz.

In the case where the received radiation is pulsed radiation, the pulse may be a square wave pulse in the time domain. The pulse may be shaped in the frequency domain.

The at least one radiation source may comprise a plurality of radiation sources, for instance a plurality of lasers, and each radiation source may be configured to transmit radiation of a different frequency. The at least one radiation source may be a multimode laser configured to transmit simultaneously laser radiation of two or more different frequencies.

The device may be included in a transmitter, and the transmitter may include a transmit antenna, wherein the photoconductive device is connected to the transmit antenna, and in operation electrical signals generated in response to radiation received by the photoconductive device are passed to the transmit antenna to generate electromagnetic radiation.

The generated radiation may comprise radiation in the terahertz range. The generated radiation may be continuous wave (CW) radiation. Preferably the generated radiation comprises radiation having a frequency in at least one of the range from 25 GHz to 10 THz, the range from 50 GHz to 5 THz, the range from 100 GHz to 3 THz, and the range from 1 THz to 3 THz. Preferably the generated radiation has at least one frequency greater than or equal to 1 THz.

The device may be included in a detector, the detector may include detection circuitry and the photoconductive device may be connected to the detection circuitry. In operation electrical signals generated in response to radiation received by the photoconductive device may be passed to the detection circuitry.

The electrodes of the photoconductive device may be connected to detection circuitry to detect electrical signals generated by the photoconductive device in response to the electromagnetic radiation to be detected. The detection circuitry may be configured to measure and/or process the electrical signals.

The device may be arranged so that, in operation, both electromagnetic radiation to be detected and modulating electromagnetic radiation are received by the photoconductive device. The device may be arranged so that the electromagnetic radiation to be detected is received at one side of the device and modulating electromagnetic radiation is received at the other side of the device, or so that the electromagnetic radiation to be detected and the or a modulation signal are both received at the same side of the device.

In a further, independent aspect there is provided a method of manufacture of a photoconductive device, comprising forming a stack of photoconductive layers on a substrate, each photoconductive layer comprising photoconductive material and a respective plurality of electrodes, and electrically connecting together the stacked photoconductive layers.

The electrical connecting of the stacked photoconductive layers may comprise one of:—electrically connecting the layers in series; and electrically connecting the layers in parallel. The photoconductive material may comprise a silicon-based material.

The photoconductive material preferably comprises one of nano-crystalline silicon and amorphous silicon, and preferably comprises one of hydrogenated nano-crystalline silicon and hydrogenated amorphous silicon The substrate preferably comprises at least one of diamond and SiC.

The forming of each photoconductive layer may comprise depositing photoconductive material using at least one of: a vapour deposition process; a molecular beam epitaxy (MBE) process; a lithography process, in particular deep ultraviolet lithography; and a chemical or thermal decomposition process.

The method may further comprising selecting at least one of:—the photo-conducting material; the number of photoconductive layers; the electrical connections between the layers being series or parallel connections; the size of the layers and/or the electrodes; and the geometry of the layers and/or electrodes in order to obtain a desired value of the quantity R.C, where R is the electrical resistance of the device and C is the capacitance of the device.

In another independent aspect, there is provided a transmitter comprising:—a photoconductive device comprising a plurality of photoconductive layers, each photoconductive layer comprising photoconductive material and a respective plurality of electrodes, wherein the photoconductive layers are electrically connected together; a source of electromagnetic radiation for applying electromagnetic radiation to the photoconductive device; and a transmit antenna electrically connected to the photoconductive device to receive electrical signals generated by the photoconductive device in response to the applied electromagnetic radiation.

The applied electromagnetic radiation may be a mixture or superposition of two or more beams of electromagnetic radiation, preferably continuous wave (CW) beams of electromagnetic radiation. Alternatively, the applied electromagnetic radiation may be a pulse of electromagnetic radiation.

In a further, independent aspect there is provided a detector for detecting electromagnetic radiation comprising:—a photoconductive device for receiving a signal to be detected, comprising a plurality of stacked photoconductive layers, each photoconductive layer comprising photoconductive material and a respective plurality of electrodes, wherein the stacked photoconductive layers are electrically connected together; a source of electromagnetic radiation for applying a modulation signal to the photoconductive device; and detection circuitry electrically connected to the photoconductive device to detect electrical signals generated in response to the modulation signal and the signal to be detected.

In another independent aspect there is provided a method of generating electromagnetic radiation, comprising applying electromagnetic radiation to a photoconductive device comprising a plurality of stacked photoconductive layers, each photoconductive layer comprising photoconductive material and a respective plurality of electrodes, wherein the stacked photoconductive layers are electrically connected, the method further comprising combining the electrical signals generated in response to the electromagnetic radiation by each photoconductive layer and passing the combined signal to a transmit antenna.

In a further independent aspect there is provided a method of detecting electromagnetic radiation, comprising applying both the electromagnetic radiation to be detected and a modulation signal to a photoconductive device comprising a plurality of stacked photoconductive layers, each photoconductive layer comprising photoconductive material and a respective plurality of electrodes, wherein the stacked photoconductive layers are electrically connected, the method further comprising combining the electrical signals generated by each photoconductive layer in response to the modulation signal and the electromagnetic radiation to be detected, and passing the combined signal to detection circuitry.

The modulation signal may comprise a mixture or superposition of radiation beams, the mixture or superposition of radiation beams may have a modulation or difference frequency equal to the difference in frequencies of the mixed or superposed beams. The modulation signal may have at least one frequency in at least one of the range from 25 GHz to 10 THz, the range from 50 GHz to 5 THz, the range from 100 GHz to 3 THz, and the range from 1 THz to 3 THz. Preferably the modulation signal has at least one frequency greater than or equal to 1 THz.

Any feature in one aspect of the invention may be applied to other aspects of the invention, in any appropriate combination. In particular, apparatus features may be applied to method features and vice versa.

Embodiments of the invention will now be described, by way of example only, with reference to the accompanying drawings in which.

Figure 1:
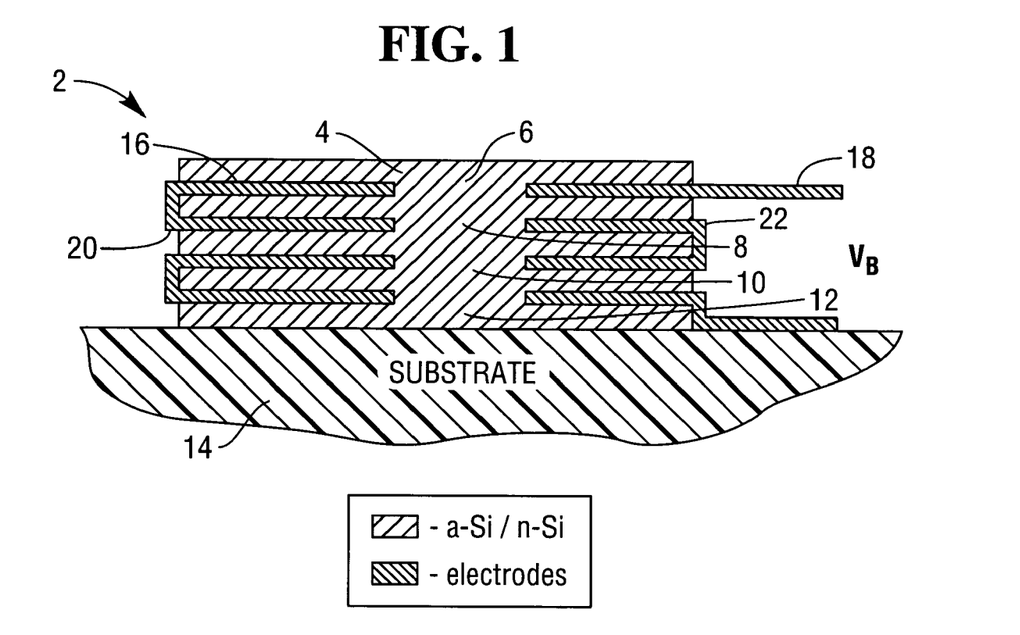
FIG. 1 is a cross-section of a photoconductive device of the preferred embodiment, showing the serial connections between the electrodes of different photomixing layers.

FIG. 1 shows a photoconductive device 2 according to the preferred embodiment. The photoconductive device 2 comprises photoconductive material 4 in the form of hydrogenated nanocrystalline silicon (nc-Si:H) which is comprised of nanoscale crystallites of silicon embedded in a matrix of amorphous silicon (a-Si).

The photoconductive material is deposited to form four photoconductive layers 6 8 10 12 on a substrate 14 of diamond. Each layer also includes a pair of electrodes 16 18 that are laid down during the deposition process. Each electrode 16 18 of each layer is electrically connected in series to an electrode of an adjacent layer 20 22.

The number of photoconductive layers is different in different embodiments. The number of photoconductive layers may be selected to provide desired response characteristics as discussed in more detail below. In variants of the preferred embodiment, intermediate layers having desired structural or electrical properties are provided between the photoconductive layers.

In the preferred embodiment, the photoconductive device 2 is used as a photomixing device, and the photoconductive layers 6 8 10 12 are photomixing layers.

Any known process for forming layered semiconductor structures may be used to manufacture the photoconductive device 2, including chemical vapour deposition, molecular beam epitaxy (MBE) or chemical or thermal decomposition. The electrodes may be formed using any known technique for forming electrical connections in semiconductor structures, including lithographic or electron beam writer techniques.

In the preferred embodiment, thin-film a-Si (<1 µm) is prepared by catalytic thermal decomposition of silane and by plasma enhanced chemical decomposition (PECVD). The thin film photoconductors are fabricated from the thin film a-Si by deposition techniques that allow band gap alteration by hot wire decomposition and hydrogen dilution techniques to provide an exact spectral match to the incident laser wavelength. That method alters the defect distribution in the devices and therefore the trapping and recombination kinetics and, in turn, the photocarrier lifetime. The photoconductive response to impulse excitation may be analysed using a range of transient and steady-state techniques in order to ensure that the desired photoconductive properties have been obtained.

In the preferred embodiment, the smaller additional features, for instance the photomixer electrodes, are formed using electron beam lithography and the larger additional features, for instance the antennae, are formed using a photolithography technique. Alternatively, and particularly for large scale production, DUV (deep ultra violet) lithography may be used for features down to 50 nm.

The same manufacturing techniques are used to produce each photomixing layer in turn. After the first layer of silicon material has been deposited, its photoconductive properties tuned, and the electrodes and connections added, a further layer of silicon material is deposited, the photoconductive properties of the further layer are tuned, and electrodes and connections added.

The nano-crystalline silicon (nc-Si:H) used as the photoconductive material displays subpicosecond electron hole recombination times ($\tau$<250 fs), and high mobilities up to (50 cm$^2$/Vs). In addition the material has excellent adhesion to the diamond substrate material, and other possible substrate materials, and displays other favourable characteristics such as low stress, variable dark electrical resistivity extending over 18 orders of magnitude and controllable optical properties (refractive index and absorption coefficient). The material also has high breakdown electric fields ($E_B$>1×10$^6$ V cm$^{-1}$ compared to $E_B$>5×10$^5$ Vcm$^{-1}$ for LT Ga—As) and thermal conductivity (k=1.3 Wcm$^{-1\circ}$ C.$^{-1}$) that is approximately three times higher than LT-GaAs (k=0.46 Wcm$^{-1\circ}$ C.$^{-1}$).

The rate of heat dissipation is also increased by the use of a substrate 14 of diamond, which has a high thermal conductivity. In contrast, prior art devices based on LT-GaAs would not include a substrate of diamond, or similar high thermal conductivity materials, as LT-GaAs generally cannot be deposited successfully on such materials.

In variants of the preferred embodiment, the substrate 14 of diamond is replaced by a substrate of SiC or other substrate material having high thermal conductivity. Also, amorphous silicon (a-Si) or hydrogenated amorphous silicon (a-Si:H) may be used instead of nano-crystalline silicon (nc-Si). All of those materials are suitable for use in ultrafast photoconductive detectors or photomixers. Carrier relaxation times of less than 4 ps, and transient mobilities of 0.5-5 cm$^2$/Vs have been measured in a-Si and hydrogenated amorphous silicon (a-Si:H).

Figure 2:
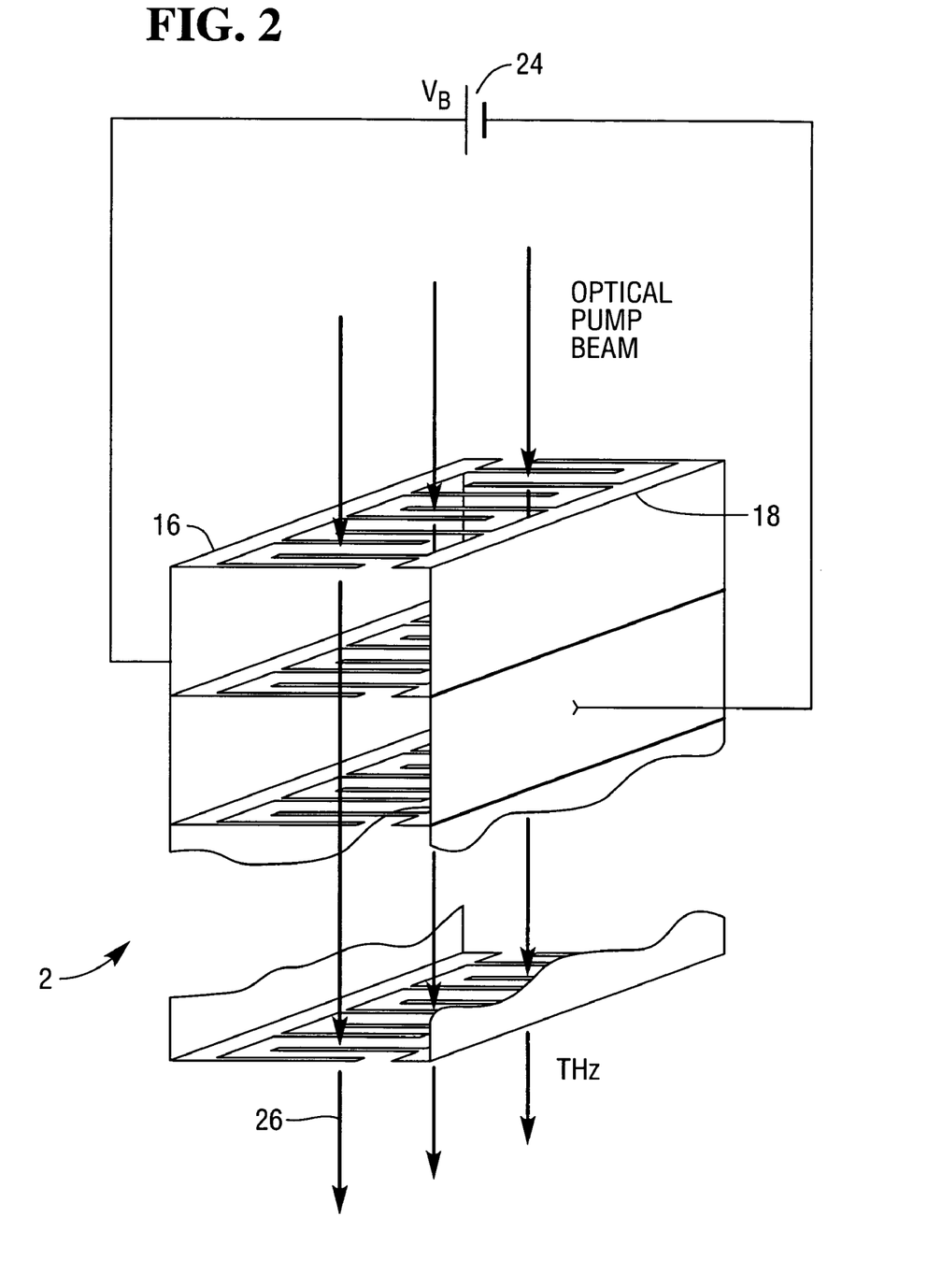
FIG. 2 is a perspective view of the photoconductive device of FIG. 1, shown connected to a bias voltage source.

FIG. 2 shows the photoconductive device 2 of the preferred embodiment in perspective-view, connected to a bias voltage source 24. It can be seen in FIG. 2 that the electrodes 16 18 of each layer are interdigitated electrodes. For each layer there are two electrodes 16 18, with each electrode having a plurality of interdigitated fingers. The passage through the photoconductive device 2 in operation of modulating signal in the form of an optical pump beam 26, in a direction perpendicular to the photoconductive layers, is also shown in FIG. 2.

Figure 3:
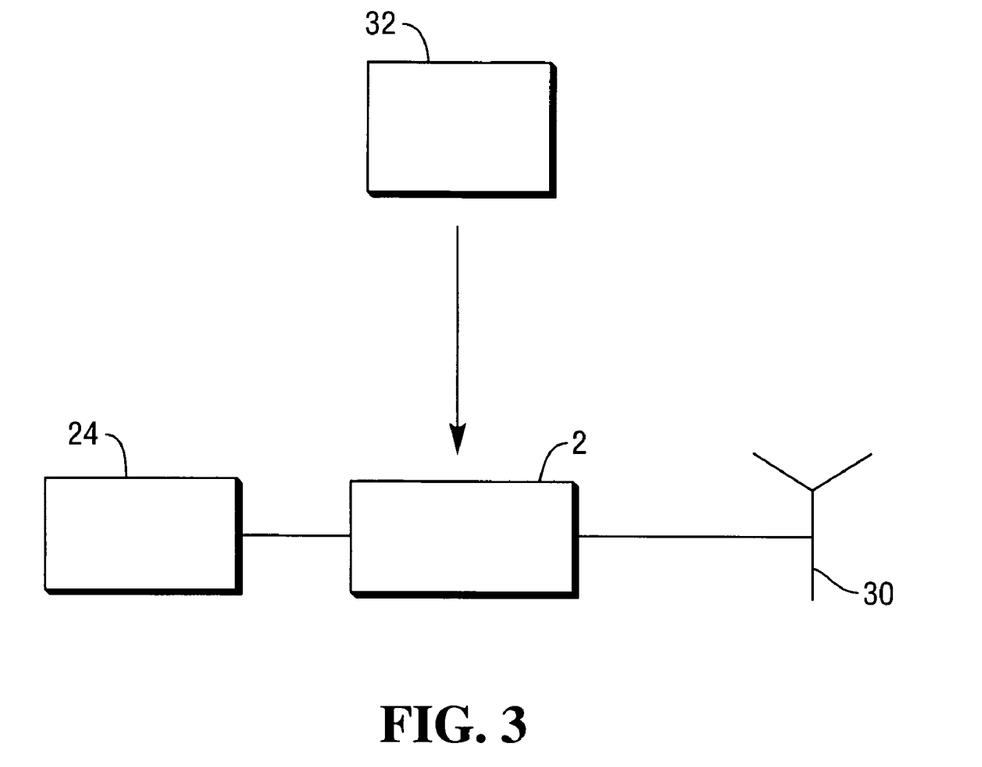
FIG. 3 is a schematic diagram of a transmitter including a photoconductive device according to the preferred embodiment

In the embodiment shown in FIGS. 1 and 2, the active area of the photoconductive device facing the optical pump beam is 6×6 μm$^2$. The interdigitated electrode fingers have widths of 0.1 μm with gaps between the electrode fingers of 0.16 μm. The total number of gaps and electrode fingers are twenty two and twenty three respectively FIG. 3 shows the photoconductive device 2 of the preferred embodiment included in a transmitter. The photoconductive device 2 is electrically connected to the bias voltage source 24 and to an antenna 30. A radiation source 32 is provided that is arranged relative to the photoconductive device 2 so as to direct modulating electromagnetic radiation to the photoconductive device 2 in a direction perpendicular to the photoconductive device layers. In the preferred embodiment, the radiation source 32 is a stable dual-wavelength system comprising InGaAs diode lasers coupled with volume Bragg gratings. The output beams from the radiation source 32 are passed through a collimating lens and focussing lens arrangement (not shown) and are focussed on the active area of the photoconductive device 2. The system has a spectral separation from 0.5 nm (0.16 THz) to 6.5 nm (2.05 THz). So, in this example, at one extreme, one beam has a wavelength of 971.5 nm and the other beam has a wavelength of 978 nm, giving a difference frequency of 2.05 THz. Powers up to 2 W can be achieved in dual-wavelength operation.

Figure 4A:
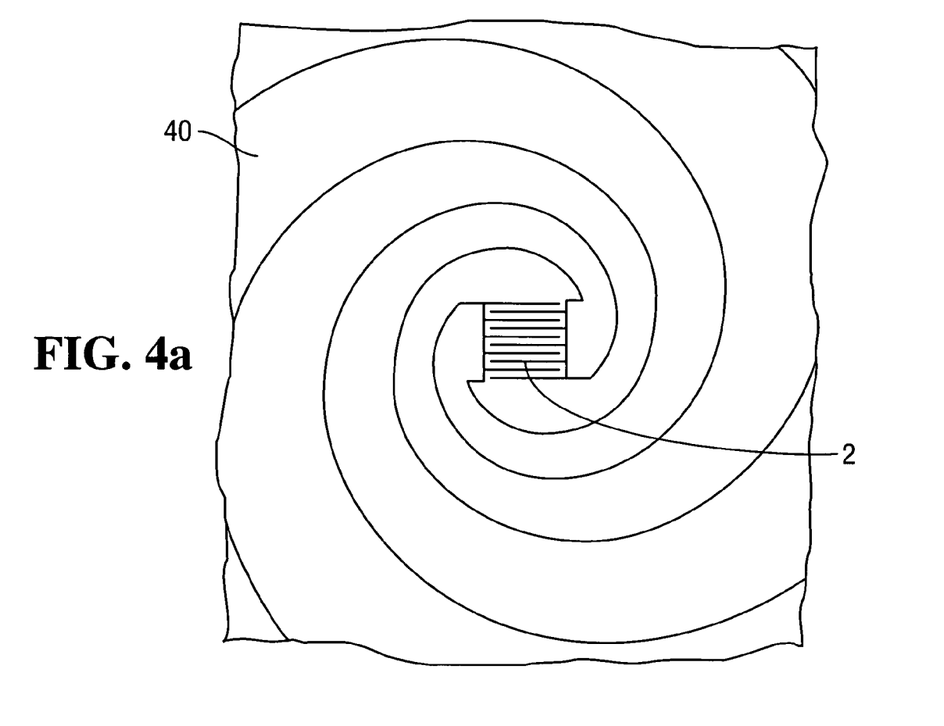
FIG. 4a is a schematic diagram showing the photoconductive device connected to a spiral antenna.
Figure 4B:
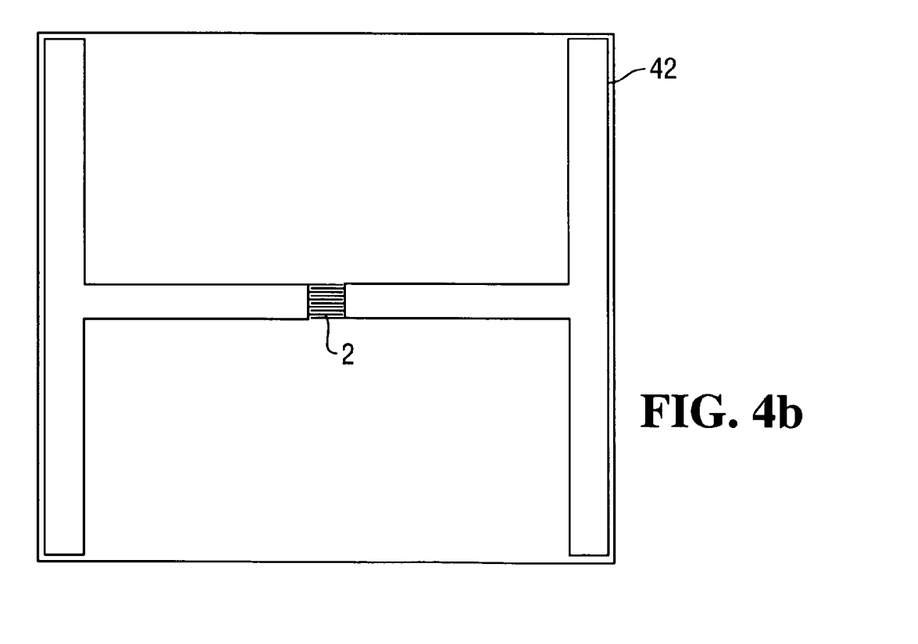
FIG. 4b is a schematic diagram showing the photoconductive device connected to a dipole antenna.

Examples of designs of antennas to which the photoconductive device 2 may be connected are shown in FIGS. 4a and 4b. In FIG. 4a, the photoconductive device 2 is connected to a self-complementary spiral antenna 40 for broadband operation. In FIG. 4b, the photoconductive device 2 is connected to a dipole antenna 42 for narrowband operation.

In operation, the bias voltage source 24 applies a d.c. bias voltage across the electrodes of each photoconductive layer 6 8 10 12 and causes a current to flow when the photoconductive device is illuminated. The radiation source 32 illuminates the photoconductive device 2 by applying a modulation signal, in the form of an optical pump beam, to the photoconducting device 2. The optical pump beam is made up of the superposition of two continuous wave (CW) laser beams from the radiation source 32, having slightly different frequencies.

As the optical pump beam passes through each photoconductive layer 6 8 10 12, as shown schematically in FIG. 2, a proportion of the pump beam is absorbed by the photoconductive layer, causing a modulation of the photo-conductance of the photoconductive layer. The pump beam has a modulation or difference frequency equal to the difference in frequency between the two laser beams of which it is made up. The photo-conductance of each photoconductive layer thus varies with time at a frequency equal to the modulation or difference frequency. In turn, the variation of the photo-conductance causes the magnitude of the current flowing between the electrodes of each photoconductive layer, driven by the d.c. bias voltage, to vary with a frequency equal to the modulation or difference frequency.

In the arrangement of FIG. 3, the resulting a.c. currents from the photoconductive layers connected in series flow through the antenna 30 causing the generation and transmission of electromagnetic radiation at the modulation or difference frequency. In one variant of the embodiment, the photoconductive device 2 and associated antenna 30 are located on a silicon hyper-hemispherical lens (not shown) aligned with a plastic lens (not shown) that are used to focus the transmitted electromagnetic radiation on a target.

Figure 5:
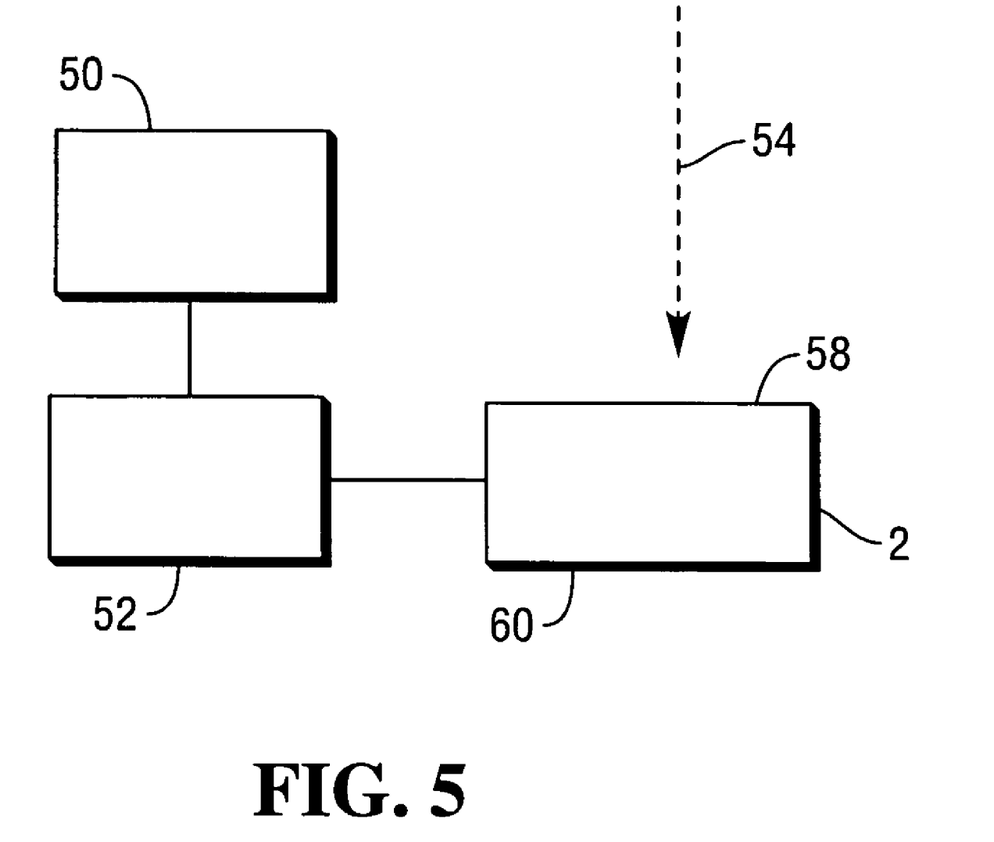
FIG. 5 is a schematic diagram showing a detector including a photoconductive device according to the preferred embodiment.

In another embodiment, illustrated in FIG. 5, the photoconductive device 2 is used in a detector rather than a transmitter. The photoconductive device 2 is electrically connected to detection circuitry 50 and to an antenna structure 52. A laser radiation source is provided, and is arranged relative to the photoconductive device 2 so that pulsed laser radiation 54 from the radiation source is received by the photoconductive layers.

When the laser pulse hits the photoconductive device 2 it creates short-lived pairs of electrons and holes. The terahertz radiation to be detected is received at the antenna structure 52 and the pairs of electrons and holes flow through the antenna structure under the influence of the electric field of the incoming terahertz radiation. The current flowing through the antenna structure is detected by the detection circuitry 50.

Because the detection circuitry 50 is detecting the terahertz radiation only during the picosecond or so corresponding to the length of the laser pulse, the application of several laser pulses is needed to obtain the full waveform of the incoming terahertz radiation. To obtain the full waveform, the time of arrival of the laser pulse is incremented by small amounts, by increasing the optical path length of the laser pulse to the photoconductive device 2 by small amounts. The electric current through the antenna, corresponding to the electric field received at the antenna, is measured for each increment to produce measurements of slices of the terahertz wave. The sliced measurements are then combined to obtain the full waveform.

A pair of tuned continuous wave lasers, having a difference frequency in the terahertz range, may be used instead of the pulsed source. In that case, the signal generated by reception of the received terahertz radiation at the antenna is modulated at the difference frequency, to produce a d.c. output signal at the detection circuitry representative of the component of the received terahertz radiation at the difference frequency. The modulating or difference frequency may be varied by controlling operation of the tuned laser sources, and thus the detection frequency may be swept through a desired range.

The embodiments described above are multi-layered structures in which the different photoconductive layers are electrically connected in series. It has been found for some embodiments that such serially connected photoconductive layers may provide better performance at higher frequencies in the THz range, with output power at higher frequencies in particular being higher, and with the roll-off at higher frequencies being less steep, than for single layer photoconductive devices.

Figure 6:
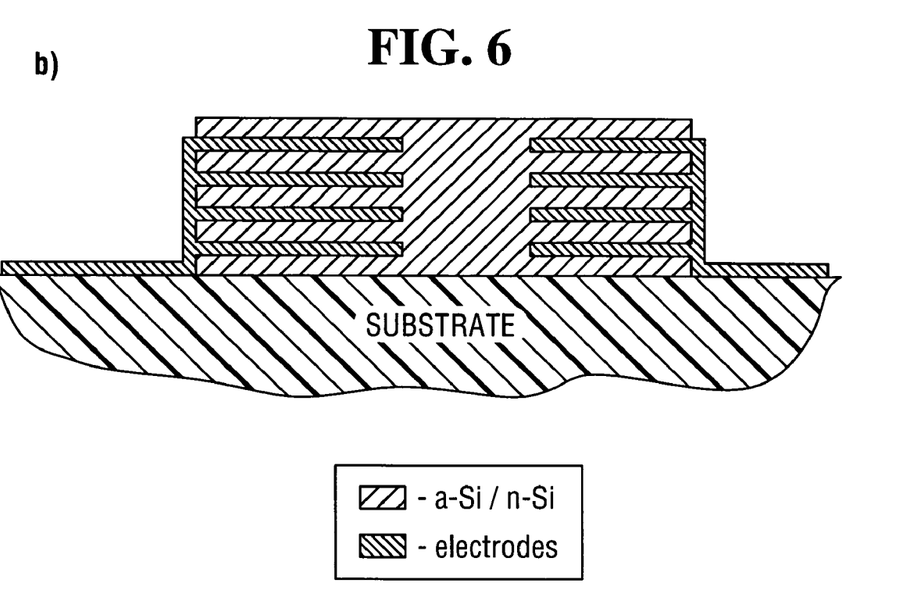
FIG. 6 is a cross-section of a variant of the photoconductive device of FIG. 1, in which the electrodes of different photoconductive layers are electrically connected in parallel.

In variants of the embodiments, the different photoconductive layers are electrically connected in parallel. An example of a variant of the device of FIG. 1, in which the photoconductive layers are connected in parallel, is shown in FIG. 6. Connecting the layers in parallel rather than series may be suitable for particular applications, and desired power versus frequency characteristics may be obtained at particular regions of the power versus frequency spectrum.

In the embodiments described above, two or more beams of radiation of different frequencies are mixed in the photoconductive layers, producing output currents at the modulation or difference frequency. The photoconductive layers thus function as photomixing layers and the device operates as a photomixing device. Narrowband radiation is produced at the difference frequency.

The embodiments may also be used in broadband terahertz techniques in which a pulse of radiation is applied to the photoconductive layers. Transient currents are produced in response to the pulsed radiation, having a wide range of different frequency components. The transient currents are passed through an antenna, producing pulsed radiation having a wide range of different frequencies. The length of the applied pulse is selected in the preferred embodiment is selected to be sufficiently short to ensure that the radiation that is produced has components at Terahertz frequencies.

The use of silicon-based materials, such as amorphous silicon (a-Si) or nano-crystalline silicon (nc-Si), in the described embodiments, and the use of substrates with high thermal conductivities, provide for photoconductive devices which can include any desired number of photoconductive layers and which can dissipate heat effectively. Thus, higher optical powers may be applied to such devices without causing problems due to overheating, thus providing for higher output powers.

In order to understand the advantageous effects that may be obtained in certain embodiments using multiple serially or parallel connected photoconductive layers, the output power as a function of difference or modulation frequency and as a function of optical pump power for single and multiple layer photomixers, including Si based and LT-GaAs based photomixers, has been modelled.

The photomixers that have been modelled included a photomixer comprising three photomixing Si-based layers connected in series, a single layer LT-GaAs photomixer, and Si-based photomixers having 1, 2 and 6 layers connected either in series or parallel.

Figure 7:
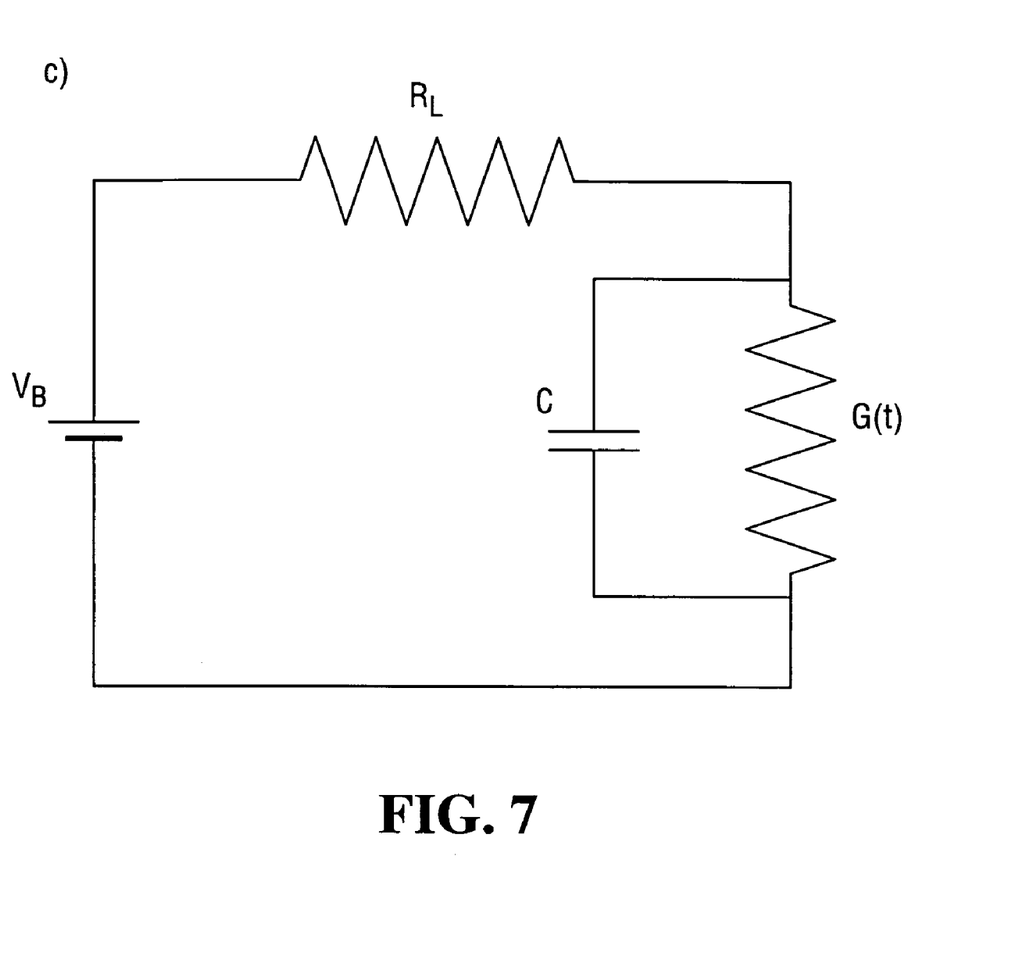
FIG. 7 is a model circuit representing the photoconductive device circuit.

It has been found that the photomixer can be modelled as the model circuit shown in FIG. 7, comprising a bias voltage source having a bias voltage $V_B$, a resistor $R_L$ representing the radiation impedance, equal to the overall resistance of the antenna (typically from 30Ω to 250Ω.), an electrical resistance representative of the time-varying photoconductance $G(t)$ of the photomixer, and a capacitor representative of the capacitance C of the photomixer 2.

The model for the photomixer circuit takes account of the photoconductance $G(t)$, that is a function of the absorbed optical power, the radiation impedance $R_L$, the capacitance C (determined by the electrode geometry), the dielectric constant of the material and the voltage bias $V_B$.

A model for the output power of a single layered photomixer has been provided in Brown et al, "Coherent millimeter-wave generation by heterodyne conversion in low-temperature-grown GaAs photoconductors", J. Appl. Phys. 73, 1480-1484 (1993). It has now been found that the single-layered model can be adapted for the multi-layered case, both when the layers are electrically connected in parallel and when the layers are electrically connected in series.

The photoconductance in the multi-layered case is:

$$G_0 = \frac{\eta \cdot \tau \cdot e \cdot \mu \cdot N_g^2 \cdot P_0 \cdot (1-r) \cdot [1 - \exp[-(N-0.5) \cdot \alpha \cdot d]]}{hv(N_g \cdot W_g + N_e \cdot W_e)^2} \quad (1)$$

in which, $\eta$ is the internal quantum efficiency, $\tau$ is the carrier lifetime, e is the electron charge, $\mu$ is the mobility of the charge carriers (averaged for both electrons and holes), $N_g$ is the number of gaps between the fingers of the electrodes for each layer, $N_e$ is the number of fingers of the electrodes of each layer, $P_0$ is the power of the incident electromagnetic radiation, r is the reflectivity of the surface on which the electromagnetic radiation is incident, N is the number of photoconductive layers, $\alpha$ is an absorption coefficient, d is the thickness of each layer, h is Planck's constant, v is frequency, $w_g$ is the average width of the gap between the fingers of the electrodes, and $w_e$ is the average width of a finger of the electrodes.

The capacitance, C, can be expressed as a function of the electrode geometry and the dielectric constant of the photoconductive material, derived from electrostatic theory.

For parallel-connected multiple layers the capacitance is:—

$$C \approx \frac{\pi \cdot (1 + \varepsilon_r)\varepsilon_0 \cdot A \cdot N}{2(W_g + W_e)\log\left[2\frac{(1+\sqrt{k})}{(1-\sqrt{k})}\right]} \quad (2)$$

in which $\varepsilon_r$ is the relative permittivity, $\varepsilon_0$ is the permittivity of free space, A is the active area of the photoconductive device, and k is a constant.

For serially-connected multiple layers the capacitance is:—

$$C \approx \frac{\pi \cdot (1 + \varepsilon_r)\varepsilon_0 \cdot A}{2N(W_g + W_e)\log\left[2\frac{(1+\sqrt{k})}{(1-\sqrt{k})}\right]} \quad (3)$$

In the small-signal limit theory ($G_0 R_L \ll 1$) [2], the difference-frequency power (that is, the output power as a function of difference or modulation frequency is reduced to:

$$P_\omega = \frac{R_L \cdot (V_B G_0)^2}{2(1 + \omega^2 \tau^2)(1 + \omega^2 R_L^2 C^2)} \quad (4)$$

in which $R_L$ is the load resistance, $V_B$ is the bias voltage and $\omega$ is the difference or modulation frequency.

The total active area of the modelled Si-based photomixer is 6×6 μm², with gap and electrode widths ($W_g$, $W_e$) of 0.16 and 0.1 μm, making the total number of gaps and electrodes ($N_g$, $N_e$) 22 and 23 respectively.

The geometry of the Si-based photomixer is optimised for efficient operation at 1 THz and 2.5 THz for an optical pump power $P_0$ of 50 mW ($\lambda$=850 nm). The following parameters were used to model the device: $\tau$=1 ps, $\in$=11.8, $\mu_e$=40 cm$^2$/Vs, d=300 nm, $\alpha$=1×10$^4$ cm$^{-1}$, r=0.3, $\eta$=0.9 and $R_L$=50$\Omega$.

Using the same equations, a model for a LT-GaAs photomixer was set up with these parameters; $W_g$=0.2 μm, $W_e$=1.8 μm, $N_g$=9, $N_e$=10, $\tau$=0.27 ps, $\in$=12.8, $\mu_e$=167 cm$^2$/Vs, d=1.2 μm, $\alpha$=1.5×10$^4$ cm$^{-1}$, r=0.3, $\eta$=0.9 and $R_L$=50$\Omega$. The total active area was 20×20 μm$^2$. This model concurred with experimental measurements of a similar LT-GaAs photomixer.

Figure 8:
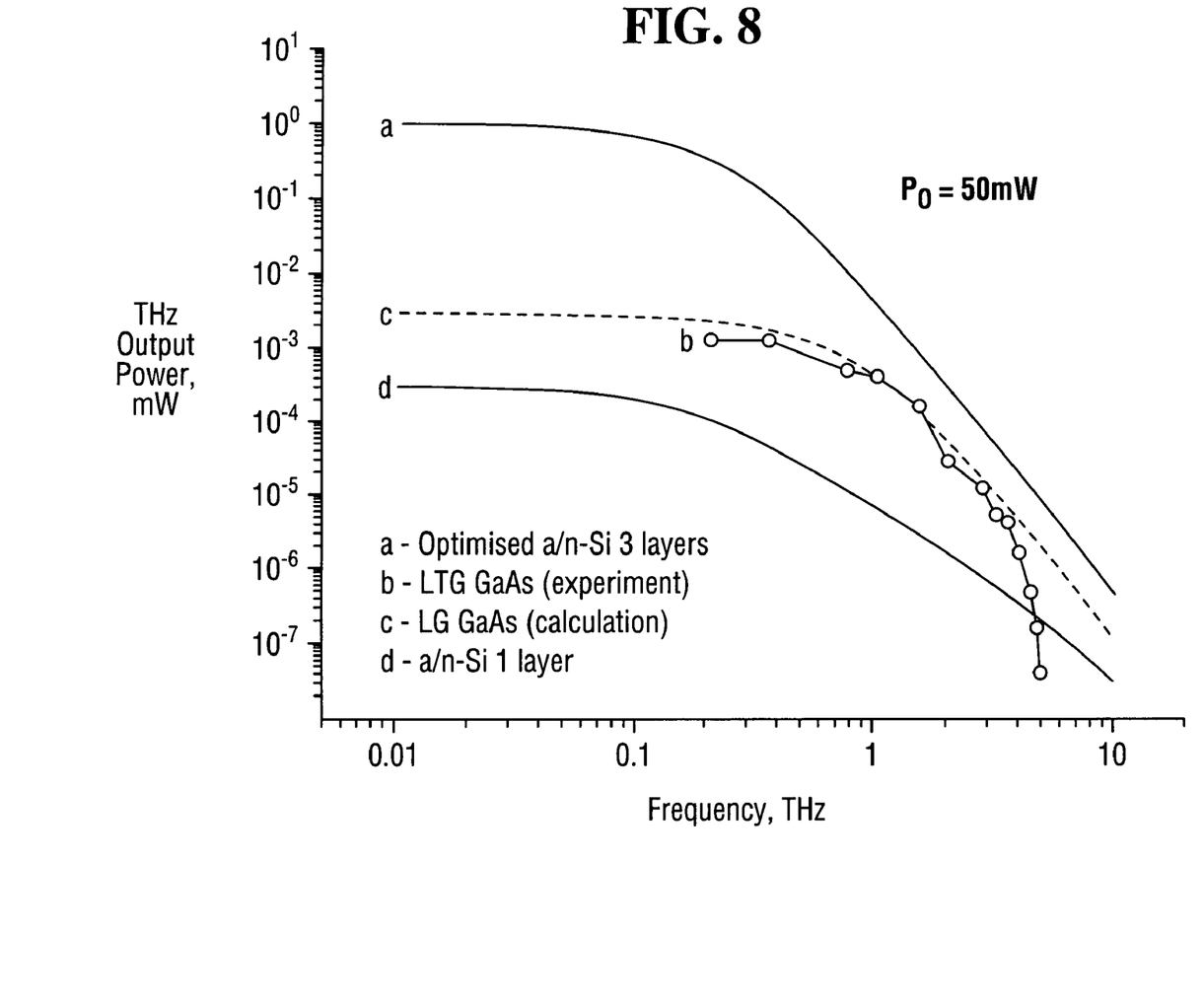
FIG. 8 is a graph of calculated output power versus difference frequency for various single-layer photomixers and a three-layer photomixer.

FIG. 8 provides a comparison between the following photomixers: (a) optimised three-layered Si-based, (b) LT-GaAs (experimental results), (c) LT-GaAs (model), and (d) single layered Si-based (model), using similar dimensions.

It can be seen that at 1 THz the modelled LT-GaAs device produces an output power of 4.61×10$^{-4}$ mW, whereas the optimised 3-layered serially-connected Si-based device produces 4.62×10$^{-3}$ mW. In fact, it can be seen from FIG. 8 that the three-layered, serially connected Si-based device produced higher power then the single layered GaAs device and the single-layered Si-based device at all frequencies.

As previously mentioned, the Si-based material can have three times better thermal conductivity than LT-GaAs, and may be grown on substrates such as diamond that can have thermal conductivities up 20 times higher that GaAs. That facilitates an increase in the drive optical pump power without succumbing to overheating problems, which as a result produce significantly higher THz output powers.

Figure 9:
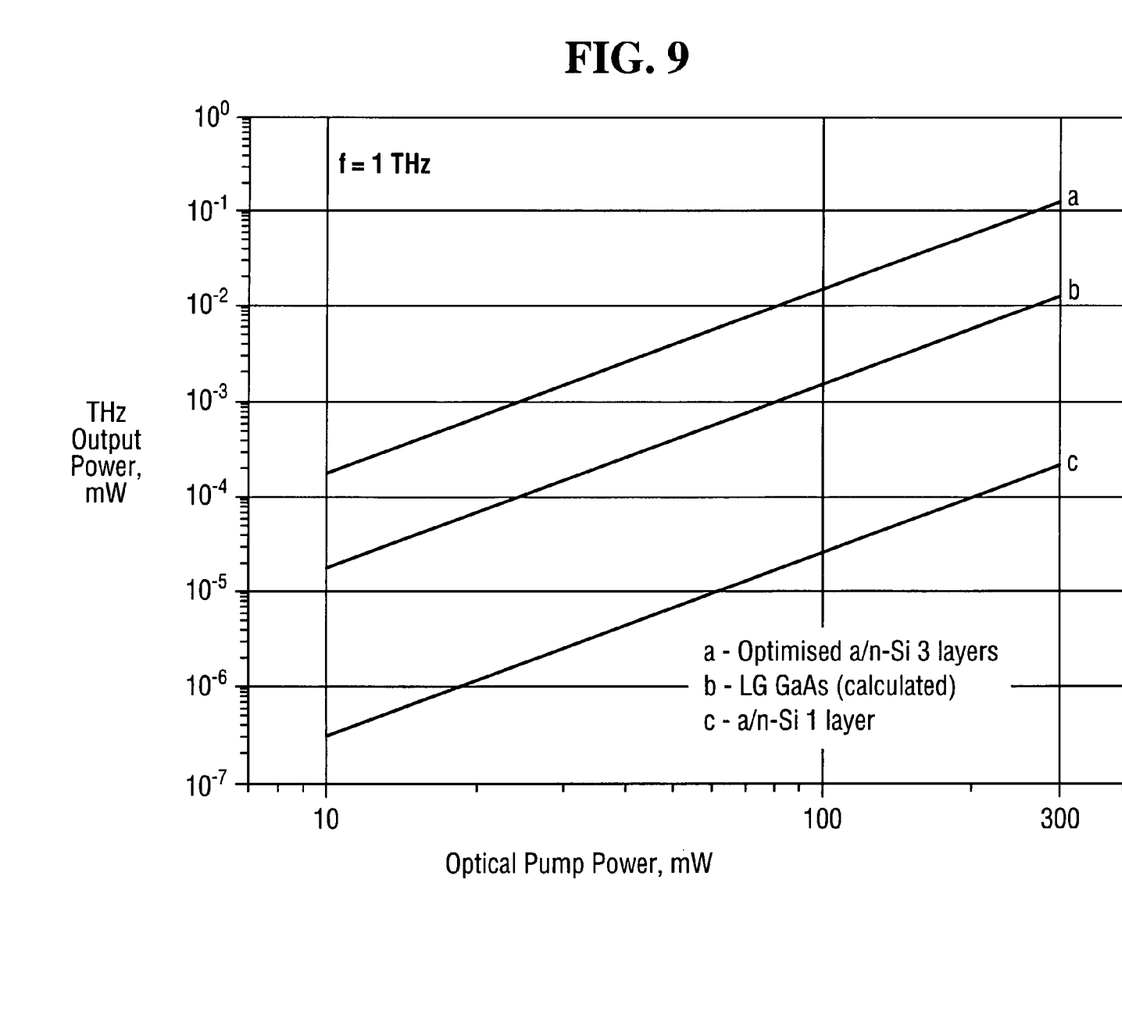
FIG. 9 is a graph of output power versus optical pump power for two different single-layer photomixers and for a three-layer photomixer.

FIG. 9 shows the calculated output for a range of optical pump power levels for a LT-GaAs device, single and 3-layered Si-based device (optimised), at 1 THz. At a pump power of 200 mW, the output is calculated to be 74 μW for a 3-layered Si-based device.

It can be seen from FIG. 9 that the output power as a function of optical pump power is significantly higher for the three-layered Si-based device than for the single layered GaAs device and the single-layered Si-based device, across all optical pump powers.

Furthermore, it is noted that at room temperature LT-GaAs devices cannot withstand pump powers above 50 mW due to overheating effects. In contrast, the Si-based devices can withstand significantly higher pump powers.

From the capacitance equations (2) and (3), it can be inferred that in a series configuration N (the number of layers) becomes a divisor rather than a multiplier, which has a pronounced effect on the output power at higher frequencies.

Figure 10:
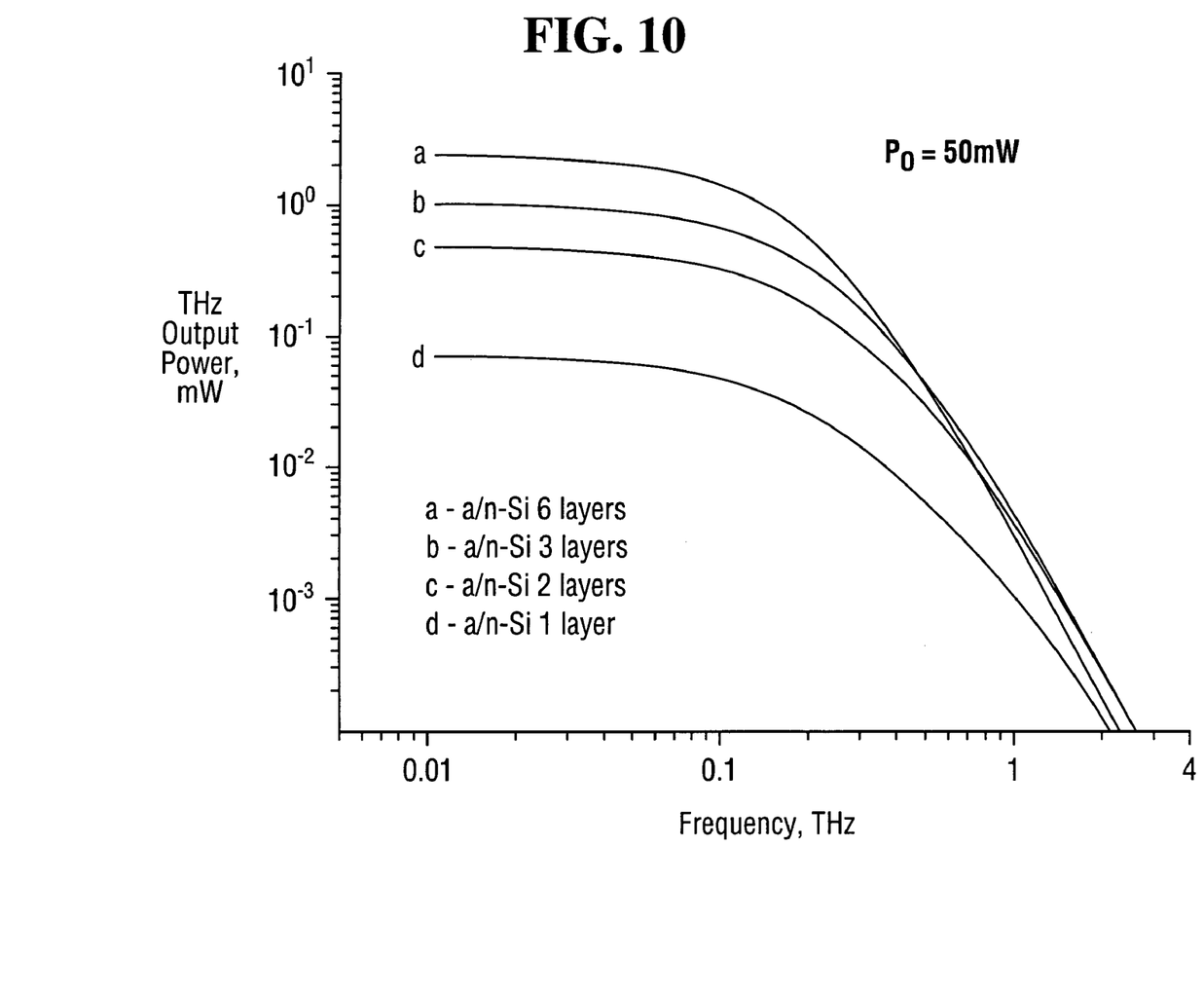
FIG. 10 is a graph of calculated output power versus difference frequency for various Si photomixers having different numbers of layers connected in a parallel configuration.
Figure 11:
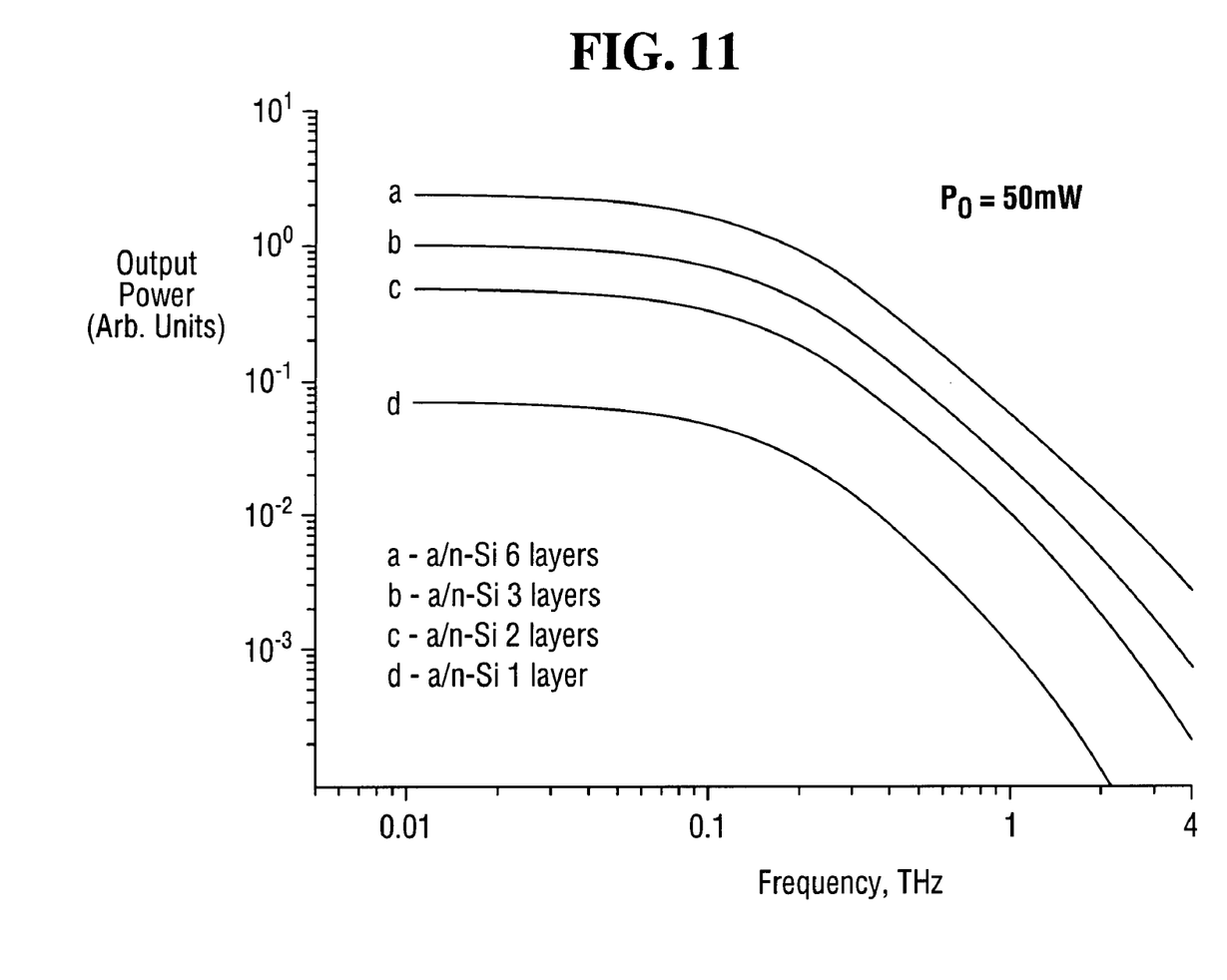
FIG. 11 is a graph of calculated output power versus difference frequency for various Si photomixers having different numbers of layers connected in a series configuration.

FIG. 10 illustrates output power levels for single, 2, 3, and 6-layered devices in parallel configuration. At higher frequencies the 6-layered device has the sharpest attenuation rate. FIG. 11 illustrates output power levels for the same single, 2, 3, and 6-layered devices in series rather than parallel configuration.

It can be seen from comparison of FIGS. 10 and 11 that that the series configuration provides significantly better characteristics at higher frequencies, with the roll-off at the higher frequencies being less sharp for the series configuration than for the parallel configuration. Thus, the series configuration may be more suitable for applications at higher THz frequencies. The series configuration can also provide faster response times, because the device capacitance is lower, than an equivalent parallel configuration. The parallel configuration may provide higher photoconductance, and thus higher absorption, than an equivalent series configuration. A series configuration may be particularly suitable if a device is to be used to generate terahertz radiation, and a parallel configuration may be particularly suitable if a device is to be used to detect terahertz radiation. However, both of the parallel and series configurations can be used in either detection or generation of terahertz radiation.

By connecting the photomixing layers in series, the term N representing the number of layers in the capacitance equation becomes a divisor rather than a multiplier, so the higher the number of layers the lower the capacitance, which generates a flatter frequency response and which may extend the useful frequency range. It can be important for the photomixing device to have low capacitance, since the RC constant dictates the roll-off rate at higher frequencies.

It has been found that the output power from the serially or parallel connected photomixer device as a function of modulation or difference frequency for any given optical pump power is dependent upon the number of photomixing layers, the size and geometry of the layers and the electrodes, and the characteristics of the photo-conducting material. The variation of output power with variation of optical pump power also varies with the size and geometry of the layers and the electrodes, and the characteristics of the photo-conducting material.

It has been found that a desired power versus frequency spectrum, or desired power levels at a particular frequency or frequencies, can be obtained by selecting an appropriate RC constant for the device, which in turn can be obtained by selecting the photo-conducing material and/or by selecting the number of photomixing layers, and the size and geometry of the layers and the electrodes. By increasing the number of layers the amount of power absorbed from the modulation signal or pump beam may be increased, but the variation in the values of resistance R and capacitance C must also be taken into account to ensure that the desired power/frequency response is obtained.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. A photoconductive device comprising a plurality of photoconductive layers, each photoconductive layer comprising photoconductive material and a respective plurality of electrodes, wherein the photoconductive layers are electrically connected together.

2. A photoconductive device according to claim 1, wherein the photoconductive layers are photomixing layers and the photoconductive device is a photomixing device.

3. A photoconductive device according to claim 1, wherein the photoconductive layers are electrically connected in series.

4. A device according to claim 1, wherein the photoconductive layers are electrically connected in parallel.

5. A device according to claim 1 wherein the photoconductive material comprises a silicon-based material.

6. A device according to claim 5, wherein the photoconductive material comprises one of nano-crystalline silicon (nc-Si) and amorphous silicon (a-Si), and preferably comprises one of hydrogenated nano-crystalline silicon (nc-Si:H) and hydrogenated amorphous silicon (a-Si:H).

7. A device according to claim 1, further comprising a substrate.

8. A device according to claim 7, wherein the substrate comprises one of diamond and SiC.

9. A device according to claim 1, wherein the photo-conductive material is responsive to radiation of frequency in at least one of the range from 25 GHz to 10 THz, the range from 50 GHz to 5 THz, the range from 100 GHz to 3 THz, and the range from 1 THz to 3 THz.

10. A device according to claim 1, included in a transmitter, the transmitter including a transmit antenna, wherein the photoconductive device is connected to the transmit antenna, and in operation electrical signals generated in response to radiation received by the photoconductive device are passed to the transmit antenna to generate electromagnetic radiation.

11. A device according to claim 1, including in a detector, wherein the detector includes detection circuitry and the photoconductive device is connected to the detection circuitry, and in operation electrical signals generated in response to radiation received by the photoconductive device are passed to the detection circuitry.

12. A method of manufacture of a photoconductive device, comprising:
    forming a stack of photoconductive layers on a substrate, each photoconductive layer comprising photoconductive material and a respective plurality of electrodes, and
    electrically connecting together the stacked photoconductive layers.

13. A method according to claim 12, wherein the electrical connecting of the stacked photoconductive layers comprises one of: electrically connecting the layers in series; and electrically connecting the layers in parallel.

14. A method according to claim 12, wherein the photoconductive material comprises a silicon-based material.

15. A method according to claim 14, wherein the photoconductive material comprises one of nano-crystalline silicon and amorphous silicon, and preferably comprises one of hydrogenated nano-crystalline silicon and hydrogenated amorphous silicon.

16. A method according to claim 12, wherein the substrate comprises at least one of diamond and SiC.

17. A method according to claim 12 further comprising selecting at least one of:—the photo-conducting material; the number of photoconductive layers; the electrical connections between the layers being series or parallel connections; the size of the layers and/or the electrodes; and the geometry of the layers and/or electrodes in order to obtain a desired value of the quantity R.C, where R is the electrical resistance of the device and C is the capacitance of the device.

18. A transmitter comprising:
    a photoconductive device comprising a plurality of photoconductive layers, each photoconductive layer comprising photoconductive material and a respective plurality of electrodes, wherein the photoconductive layers are electrically connected together;
    a source of electromagnetic radiation for applying electromagnetic radiation to the photoconductive device; and
    a transmit antenna electrically connected to the photoconductive device to receive electrical signals generated by the photoconductive device in response to the applied electromagnetic radiation.

19. A detector for detecting electromagnetic radiation comprising:
    a photoconductive device for receiving a signal to be detected, comprising a plurality of stacked photoconductive layers, each photoconductive layer comprising photoconductive material and a respective plurality of electrodes, wherein the stacked photoconductive layers are electrically connected together;
    a source of electromagnetic radiation for applying a modulation signal to the photoconductive device; and
    detection circuitry electrically connected to the photoconductive device to detect electrical signals generated in response to the modulation signal and the signal to be detected.

20. A method of generating electromagnetic radiation, comprising:
    applying electromagnetic radiation to a photoconductive device comprising a plurality of stacked photoconductive layers, each photoconductive layer comprising photoconductive material and a respective plurality of electrodes, wherein the stacked photoconductive layers are electrically connected,
    combining electrical signals generated in response to the electromagnetic radiation by each photoconductive layer, and
    passing the combined signal to a transmit antenna.

21. A method of detecting electromagnetic radiation, comprising:
    applying both the electromagnetic radiation to be detected and a modulation signal to a photoconductive device comprising a plurality of stacked photoconductive layers, each photoconductive layer comprising photoconductive material and a respective plurality of electrodes, wherein the stacked photoconductive layers are electrically connected,
    combining electrical signals generated by each photoconductive layer in response to the modulation signal and the electromagnetic radiation to be detected, and
    passing the combined signal to detection circuitry.

* * * * *